(12) United States Patent
Gravermann et al.

(10) Patent No.: US 9,739,820 B2
(45) Date of Patent: Aug. 22, 2017

(54) CONDUCTOR ASSEMBLY

(71) Applicant: 3M INNOVATIVE PROPERTIES COMPANY, St. Paul, MN (US)

(72) Inventors: Mark Gravermann, Erkelenz (DE); Friedrich A. Busemann, Amelinghausen (DE); Gerhard Lohmeier, Cologne (DE); Jens Weichold, Erkelenz (DE); Bernd Schubert, Cologne (DE); Michael H. Stalder, Uedem (DE); Pasquale Zanoli, Villa Cortese (IT); Giuliano Bolcato, Dugnano (IT)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/897,680

(22) PCT Filed: Jun. 19, 2014

(86) PCT No.: PCT/US2014/043103
§ 371 (c)(1),
(2) Date: Dec. 11, 2015

(87) PCT Pub. No.: WO2014/205170
PCT Pub. Date: Dec. 24, 2014

(65) Prior Publication Data
US 2016/0124035 A1    May 5, 2016

(30) Foreign Application Priority Data
Jun. 19, 2013  (EP) ..................................... 13172902

(51) Int. Cl.
*G01R 27/26*    (2006.01)
*G01R 31/02*    (2006.01)
(Continued)

(52) U.S. Cl.
CPC ........... *G01R 31/021* (2013.01); *G01R 15/16* (2013.01); *G01R 27/2605* (2013.01);
(Continued)

(58) Field of Classification Search
CPC ...... G01R 31/02; G01R 31/08; G01R 31/081; G01R 31/083; G01R 31/085;
(Continued)

(56) References Cited

U.S. PATENT DOCUMENTS 5,051,733 A    9/1991  Neuhouser
5,065,142 A    11/1991 Green
(Continued)

FOREIGN PATENT DOCUMENTS

DE    3702735    8/1988
DE    4125856    9/1992
(Continued)

OTHER PUBLICATIONS

Scotch® Electrical Semi-Conducting Tape 13, Sep. 2012, 4 pages. XP-002716558.
(Continued)

*Primary Examiner* — Hoai-An D Nguyen
(74) *Attorney, Agent, or Firm* — Gregg H. Rosenblatt

(57) ABSTRACT

A conductor assembly for a power network includes an inner conductor, an insulating layer arranged concentrically around the inner conductor, and a sensing electrode, arranged radially outward of the insulating layer, and operable as a first electrode of a sensing capacitor of a voltage sensor. The conductor assembly further includes a voltage pickup element having electrically conductive major surfaces, the first major surface being in a surface contact with the sensing electrode. The conductor assembly further includes an electrode wire, in electrical and mechanical contact with the voltage pickup element, for electrically
(Continued)

Figure 1:
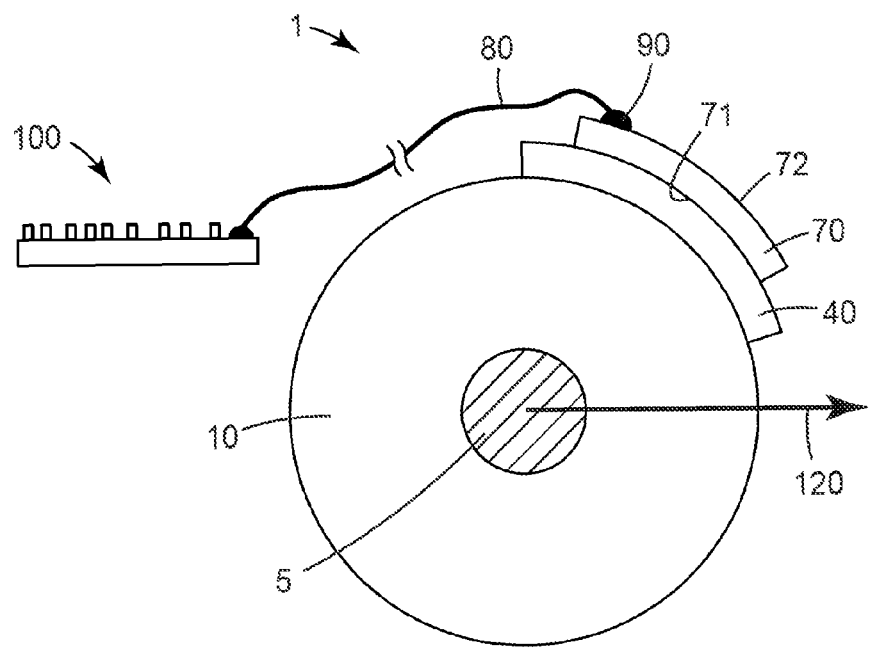

connecting the voltage pickup element with an electric or electronic component disposed remote from the sensing electrode.

10 Claims, 3 Drawing Sheets

(51) Int. Cl.
　　*G01R 15/16*　　(2006.01)
　　*G01R 31/12*　　(2006.01)
　　*H01B 9/00*　　(2006.01)

(52) U.S. Cl.
　　CPC ......... *G01R 31/1272* (2013.01); *H01B 9/006* (2013.01); *G01R 27/26* (2013.01)

(58) Field of Classification Search
　　CPC .. G01R 31/086; G01R 31/1272; G01R 27/00; G01R 27/02; G01R 27/04; G01R 27/08; G01R 27/26; G01R 27/2605; G01R 31/021; G01R 15/16; G01D 5/24; G01D 5/2405; G01D 5/241; G01D 5/2412; G01D 5/2417; G06F 3/044; H01B 9/006
　　USPC ....... 324/600, 649, 658, 661, 662, 663, 691, 324/713, 660, 686
　　See application file for complete search history.

(56) References Cited

U.S. PATENT DOCUMENTS

| | | | |
|---|---|---|---|
| 5,767,684 | A | 6/1998 | Steennis |
| 6,236,218 | B1 | 5/2001 | Johansson |
| 1,674,164 | A1 | 10/2005 | Prunk et al. |
| 1,642,710 | A1 | 9/2006 | Bolcar |
| 7,230,411 | B2 | 6/2007 | Mulligan |
| 7,746,082 | B2 * | 6/2010 | Maruyama ......... G01R 31/1254 324/536 |
| 8,099,251 | B2 | 1/2012 | Schipper |
| 2009/0027062 | A1 | 1/2009 | Maruyama |
| 2014/0021965 | A1 * | 1/2014 | De Rybel ............... G01R 15/16 324/632 |
| 2014/0368221 | A1 * | 12/2014 | Weinmann ........... G01R 15/142 324/658 |
| 2016/0084888 | A1 * | 3/2016 | Busemann ......... G01R 19/0084 324/126 |

FOREIGN PATENT DOCUMENTS

| | | |
|---|---|---|
| GB | 1058890 | 2/1967 |
| JP | 60256068 | 12/1985 |
| WO | WO 2012-130816 | 10/2012 |
| WO | WO 2014-120792 | 8/2014 |

OTHER PUBLICATIONS

Hebjogi, "Coaxial capacitive voltage divider with high division ratio for high voltage pulses with very fast rise times", Pulsed Power Conference (PPC) 2011, IEFE, Jun. 23, 2011, pp. 313-318.

International Search report for PCT International Application No. PCT/US2014/043103 mailed on Oct. 16, 2014, 4 pages.

1507 Extended Search report for EP 13172902.2, PCT/US2014/043103, Nov. 21, 2013, 10pages.

* cited by examiner

CONDUCTOR ASSEMBLY

The invention relates to a conductor assembly, such as a cable, for transmission of electrical power in power networks, that is equipped with a capacitive voltage sensor. It also relates to cables comprising such conductor assemblies, and to a power network comprising such a cable.

Operators of electrical power networks monitor the state of their networks using sensors for voltage and current on their installations and on individual cables. An example of a voltage sensor for high-voltage and medium-voltage power cables is described in the British patent GB1058890, in which the insulated conductor of the cable and a field-sensing probe electrode are surrounded by a guard electrode, and in which the guard and probe electrodes are connected to the input terminals of a high-gain amplifier.

In the German patent application DE 3702735 A1, a voltage measurement device for a cable comprises capacitive voltage divider. One of the capacitors, a high-voltage capacitor, is formed by the insulation of the central conductor of the cable and the conductive layer enveloping it. A measuring capacitor is located between the conductive layer and the shielding mesh of the cable.

The Japanese published patent application JP 60256068 A2 is related to measuring the charged voltage of a high-voltage power cable. It suggests to peel off a part of a shielding electrode of a power cable to expose an insulator. A conductive or semiconductive member is partially wound around the outer peripheral surface of the insulator to form a suspended electrode. A lead wire is embedded in and connected to said electrode.

Certain sensing electrodes may be difficult to contact electrically. For precise voltage sensing, however, a good electrical connection to the sensing electrode is required. It appears desirable to provide a conductor assembly that is easy and cost-effective to assemble. The present invention seeks to tackle such problems.

The present invention provides a conductor assembly for a power network, the conductor assembly comprising
- an inner conductor, defining axial directions and radial directions,
- an insulating layer arranged concentrically around at least an axial section of the inner conductor, and
- a sensing electrode, arranged radially outward of the insulating layer, and operable as a first electrode of a sensing capacitor of a voltage sensor, characterized by the conductor assembly further comprising
- a voltage pickup element, comprising an electrically conductive first major surface and an opposed electrically conductive second major surface, the first major surface being in a surface contact with the sensing electrode, and
- an electrode wire, in electrical and mechanical contact with the voltage pickup element, for electrically connecting the voltage pickup element with an electric or electronic component disposed remote from the sensing electrode.

The voltage pickup element comprises an electrically conductive major surface, which is in extended surface contact with the sensing electrode. An extended surface contact provides a great number of points where electrical contact is made between the voltage pickup element and the sensing electrode. This may reduce resistive losses and/or a voltage drop across the interface between the sensing electrode and the voltage pickup element. The major surface of the voltage pickup element may provide a great number of contact points even with a sensing electrode which is irregularly shaped or which has a structured surface.

Often wires are used to conduct the voltage signal of the sensing electrode to a location remote from the sensing electrode. Certain sensing electrodes may not be suitable for securing or attaching a wire thereto, e.g. because they are too thin, too brittle, or their material is not compatible with soldering or welding. A voltage pickup-element may constitute a suitable interface between the wire and such a sensing electrode. The voltage pickup element may be selected such that a wire can be secured or attached to it, e.g. by soldering, welding, or adhesively. The first major surface of the voltage pickup element, being in extended surface contact with the sensing electrode, may then provide the electrical contact between the wire and the sensing electrode.

The presence of the voltage pickup element may make it obsolete to attach or secure an electrode wire to the sensing electrode. This may save time, and may thus make the manufacturing of the conductor assembly easier and more cost-effective.

Generally, the conductor assembly according to the invention may be suitable for carrying power in a power network, e.g. for distributing electrical power in a national grid. The conductor assembly may be suitable for carrying electrical power at current levels of 50 Ampere or higher, and at voltages of 10 kilovolt (kV) or higher. The conductor assembly may, for example, comprise a medium-voltage cable or a high-voltage cable or a portion of such cables.

The inner conductor may be an elongate conductor. Its long extension defines axial directions. Radial directions are defined by being perpendicular thereto. The inner conductor may have a circular, elliptic, rectangular or irregular cross section. The insulating layer may be arranged around the inner conductor, e.g. concentrically, at least in an axial section of the inner conductor. The insulating layer may be arranged on the inner conductor, i.e. on a radially outer surface of the inner conductor. Alternatively, an intermediate layer may be arranged between the inner conductor and the insulating layer. In this case, the insulating layer may be said to be arranged around the inner conductor, but not on it.

The sensing electrode is arranged radially outward of the insulating layer. This includes the case where the sensing electrode is arranged on the insulating layer, i.e. on the radially outer surface of the insulating layer. This also includes the case where the sensing electrode is arranged around the insulating layer, e.g. extending for a full circumference of the insulating layer. This also includes the case where an intermediate layer or an intermediate element is arranged between the sensing electrode and the insulating layer.

The sensing electrode is operable as a first electrode of a sensing capacitor of a voltage sensor. The voltage sensor may be a voltage sensor for sensing a voltage of the inner conductor, e.g. relative to electrical ground or relative to some other electrical potential. The voltage sensor may be a capacitive voltage sensor. In this case, the voltage sensor may comprise a capacitive voltage divider. Such a capacitive voltage divider may comprise a first and a second dividing capacitor, electrically connected with each other. The sensing capacitor may be operable as the first dividing capacitor.

The sensing capacitor may comprise a first electrode, a second electrode, and a dielectric. The sensing electrode of the conductor assembly may be operable as the first electrode of the sensing capacitor.

The inner conductor of the conductor assembly may be operable as the second electrode of the sensing capacitor.

Alternatively, an electrically conductive element which is electrically connected to the inner conductor of the conductor assembly, i.e. a "conductor extension", may be operable as the second electrode of the sensing capacitor.

The insulating layer is arranged radially between the inner conductor and the sensing electrode. The insulating layer of the conductor assembly, or a portion of the insulating layer, may be operable as a dielectric of the sensing capacitor. More broadly, a dielectric of the sensing capacitor may comprise a portion of the insulating layer of the conductor assembly. The sensing capacitor may comprise further elements that may be operable as a dielectric of the sensing capacitor, e.g. a further layer of the conductor assembly. The dielectric may thus comprise more than the insulating layer or a portion of the insulating layer.

Generally, the sensing electrode may comprise a piece of conductive or semiconductive material. The sensing electrode and/or the piece of conductive or semiconductive material may be electrically isolated, i.e. electrically isolated from other elements of the conductor assembly, e.g. from the inner conductor, and/or from a shielding layer. The sensing electrode or the piece of (semi-) conductive material may be electrically isolated, i.e. electrically isolated from other elements of the conductor assembly, except for an electrical connection for making a signal of the sensing electrode available at a location remote from the sensing electrode.

In specific embodiments of the invention, the inner conductor of the conductor assembly may comprise an inner conductor of a medium-voltage or high-voltage power cable. The insulating layer of the conductor assembly may comprise an insulating layer of an insulated high-voltage or medium-voltage power cable. An insulated high-voltage or medium-voltage power cable may be a cost-effective, easily available means to manufacture a conductor assembly that has a voltage sensing function. Reversely, such a conductor assembly may provide a high-accuracy voltage sensing of the inner conductor of the power cable, which may be cost-effective, because it uses existing elements of the power cable.

In order to sense the voltage of the inner conductor, the sensing electrode may be electrically connectable to other electric or electronic components, so that, for example, the voltage signal of the sensing electrode is made available to those other electric or electronic components for sensing the voltage of the inner conductor. The voltage pickup element picks up the voltage signal from the sensing electrode. The electrode wire is in electrical and mechanical contact with the sensing electrode. The electrode wire may be used to transmit the voltage signal from the voltage pickup element to those other components.

The voltage pickup element has two opposed, electrically conductive major surfaces. The major surfaces may be parallel to each other. The extension of the voltage pickup element in a direction perpendicular to the first major surface may be small, relative to its extension in a direction parallel to the first major surface. In other words, the voltage pickup element may be thin. It may, for example, comprise a film or a foil. It may consist of a film or of a foil.

Both major surfaces of the voltage pickup element are electrically conductive. Thereby, the voltage pickup element may allow to establish an intimate electrical contact with the sensing electrode and provide a major surface for attachment of the electrode wire. The first major surface and the conductive second major surface may be electrically connected with each other. This may make the voltage signal, picked up by the voltage pickup element, available on the second major surface. The second major surface can thereby be used for attachment of a conductive element, e.g. of the electrode wire, which can transmit the voltage signal to a remote location.

The voltage pickup element may have an electrically conductive body portion. The body portion may be arranged between the first major surface and the second major surface. Generally, the major surfaces of the voltage pickup element may be electrically connected with each other by the conductive body portion. Generally, the voltage pickup element may be entirely electrically conductive and have two opposed major surfaces. Such voltage pickup elements may be particularly cost-effective and rugged.

Alternatively, the voltage pickup element may have an electrically insulating body portion. The insulating body portion may be arranged between the first and the second major surface. The first major surface and/or the second major surface may be formed by conductive coatings or conductive layers arranged on the non-conductive body portion. If the body portion between the conductive major surfaces is electrically insulating, the second major surface may not be electrically connected with the first major surface. A second major surface, which is electrically insulated from the first major surface, may be operable as an electrode of a capacitor. An electrically insulated body portion may thus provide the possibility to keep the second major surface on a different potential from the first major surface, which may render the voltage pickup element and the conductor assembly more versatile.

The voltage pickup element may, for example, comprise a metallized foil or film, or, generally, an element comprising a metal surface or a metallized surface. The voltage pickup element may, for example, comprise an electrically conductive foil or film, an electrically conductive polymeric film, an electrically conductive metal film or an electrically conductive metal sheet. Generally, only a portion of the first major surface may be in extended surface contact with the sensing electrode. A conductive first major surface or a conductive second major surface may be continuous. Alternatively, they may have voids.

Generally, the electrode wire may be in mechanical and electrical contact with the second major surface. This may be advantageous, because the second major surface may be easier accessible than the first major surface, which in turn may facilitate establishing the contact. Also, arranging the contact on the second major surface may allow to maximize contact area between the first major surface and the sensing electrode, because no space is required on the first major surface for accommodating the contact.

A conductor assembly according to the invention may further comprise an electrically insulating spacer layer. The spacer layer may be arranged radially between the insulating layer and the sensing electrode. A spacer layer may provide a desired distance between the inner conductor and the sensing electrode, i.e. between the electrodes of the sensing capacitor. The spacer layer or a portion of it may be operable as a further dielectric of the sensing capacitor. Its dielectric properties may affect the capacity of the sensing capacitor. The spacer layer may thus allow to adjust the voltage signal of the sensing electrode such that the voltage signal is in a desired range. A spacer layer may also allow covering an exposed portion of the sensing electrode and thereby protect the sensing electrode against environmental impacts.

Generally, the voltage pickup element may comprise a conformable portion or be conformable. Conformability may allow the voltage pickup element to conform to the sensing electrode. This may establish a better, more intimate extended surface contact with the sensing electrode, and thereby reduce resistive losses and improve accuracy of the voltage sensing.

Generally, a voltage pickup element can establish electrical contact to the sensing electrode in several locations. It thereby picks up the voltage from the sensing electrode. Electrical contact in several locations may avoid the disadvantages of having electrical contact only in one location on the sensing electrode. It may avoid, firstly, problems resulting from a bad electrical contact in the one location, if that one contact is, e.g., incomplete, corroded, or damaged. In the case of corrosion or damage, no voltage or a lower voltage can be measured on the voltage pickup element, resulting in an incorrect voltage reading of the sensor. Secondly, it also avoids problems arising from the fact that electrons travelling from a rim of the sensing electrode to a single contact location experience the electrical resistance of the sensing electrode over a longer path. This, in turn, may lead to a voltage drop and eventually to a less accurate voltage being measured.

In contrast, a conductor assembly according to the invention, having a voltage pickup element, may provide a large number of contact points on various locations on the voltage pickup element, and thereby on various locations on the sensing electrode. This creates redundancy, so that a single corroded, incomplete or damaged contact point cannot lead to an erroneous measurement of the voltage. Also, a large number of contact points will shorten the path which electrons have to travel from a rim of the sensing electrode to the next closest contact location on the voltage pickup element. This may result in a much smaller voltage drop and a higher accuracy of the voltage reading.

The voltage pickup element may be electrically connectable, or connected, to a circuit board, e.g. by the electrode wire. If the sensing electrode is arranged in a closure, the circuit board may be arranged in the same closure as the sensing electrode. If the sensing electrode is covered by a sleeve, the circuit board may be covered by the same sleeve as the sensing electrode.

The electrode wire is suitable for electrically connecting the voltage pickup element with an electric or electronic component, for example with an electric or electronic component remote from the sensing electrode. The electrode wire is in electrical and mechanical contact with the voltage pickup element. The electrode wire is electrically conductive.

The electrode wire may be elongate and may have a first end portion and a second opposed end portion. The first end portion of the electrode wire may be in electrical and mechanical contact with the voltage pickup element. It may be in electrical and mechanical contact with the first major surface or with the second major surface of the voltage pickup element. The first end portion may be attached or secured to the voltage pickup element. The first end portion may be attached or secured to the first major surface or to the second major surface of the voltage pickup element. It may be, for example, attached or secured to the first major surface or to the second major surface by soldering or welding or adhesively.

The electrode wire may be flexible. The electrode wire may be an insulated wire or comprise an insulated portion. An insulated or partly insulated electrode wire may comprise an end portion which is not insulated. This may facilitate the electrode wire to contact the voltage pickup element or the electric or electronic component.

The invention will now be described in more detail with reference to the following Figures exemplifying particular embodiments of the invention. The Figures are not to scale, and some dimensions, in particular some thicknesses of certain layers, are exaggerated for greater clarity.

Figure 2:
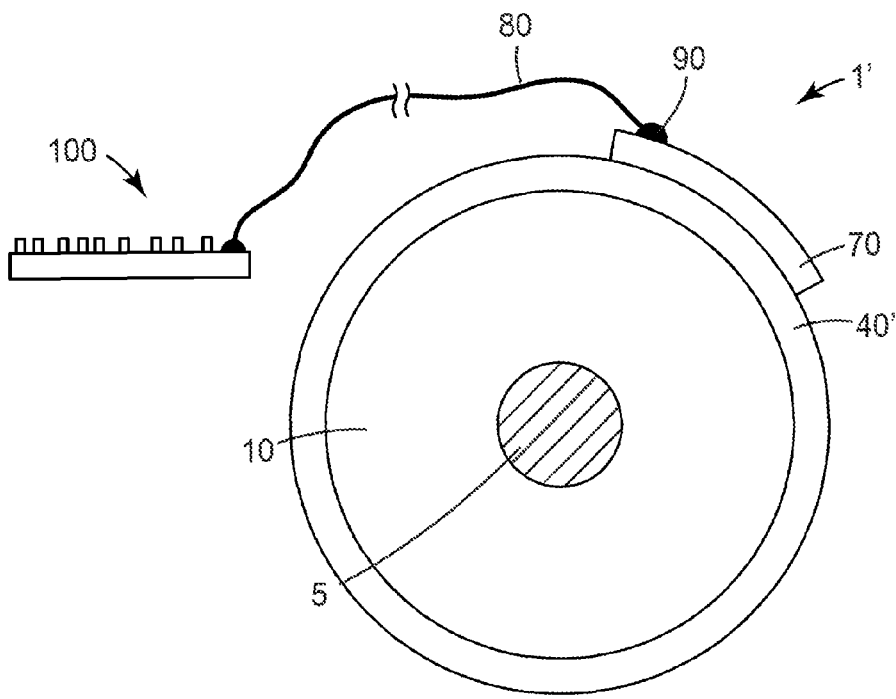
Figure 3:
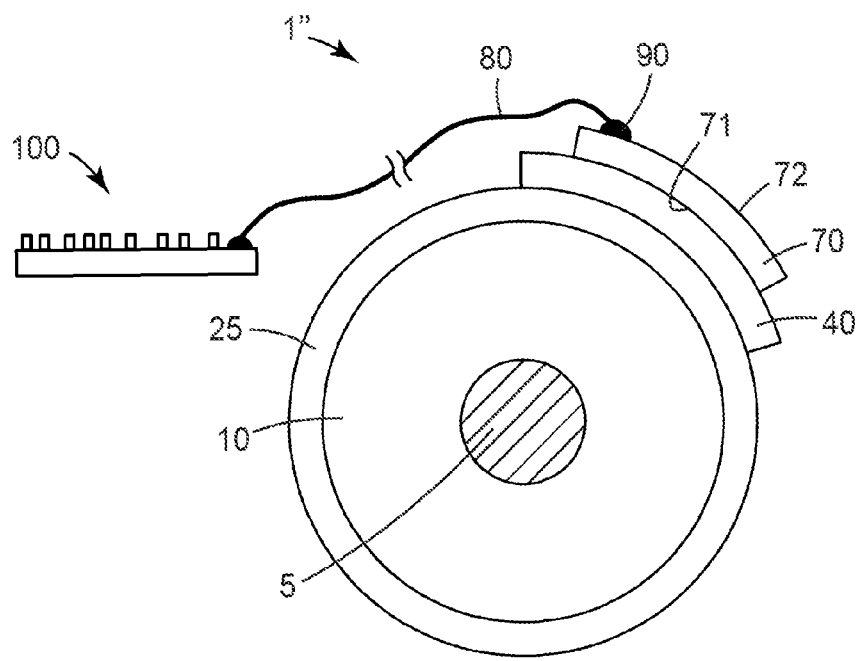
Figure 4:
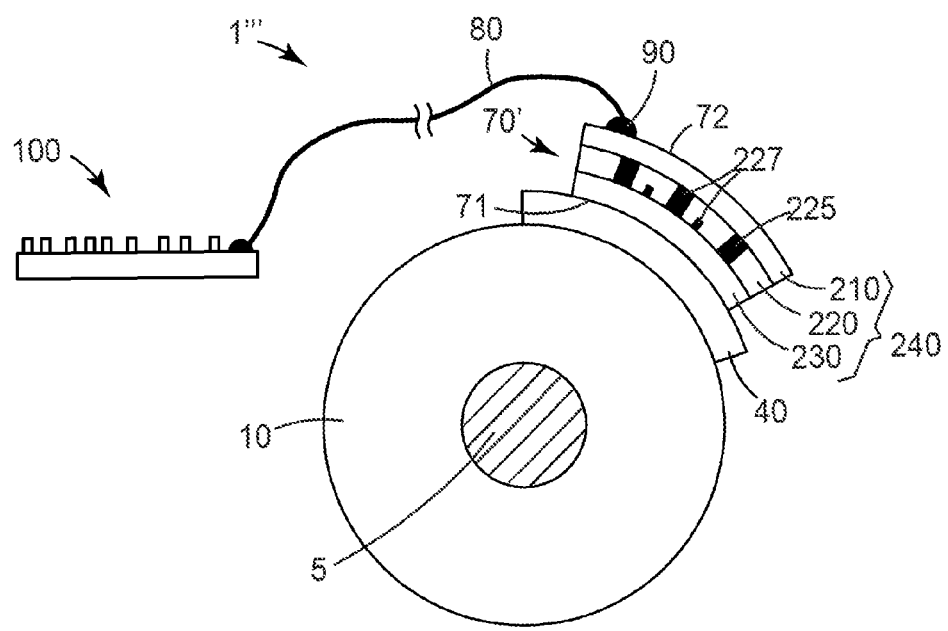
Figure 5:
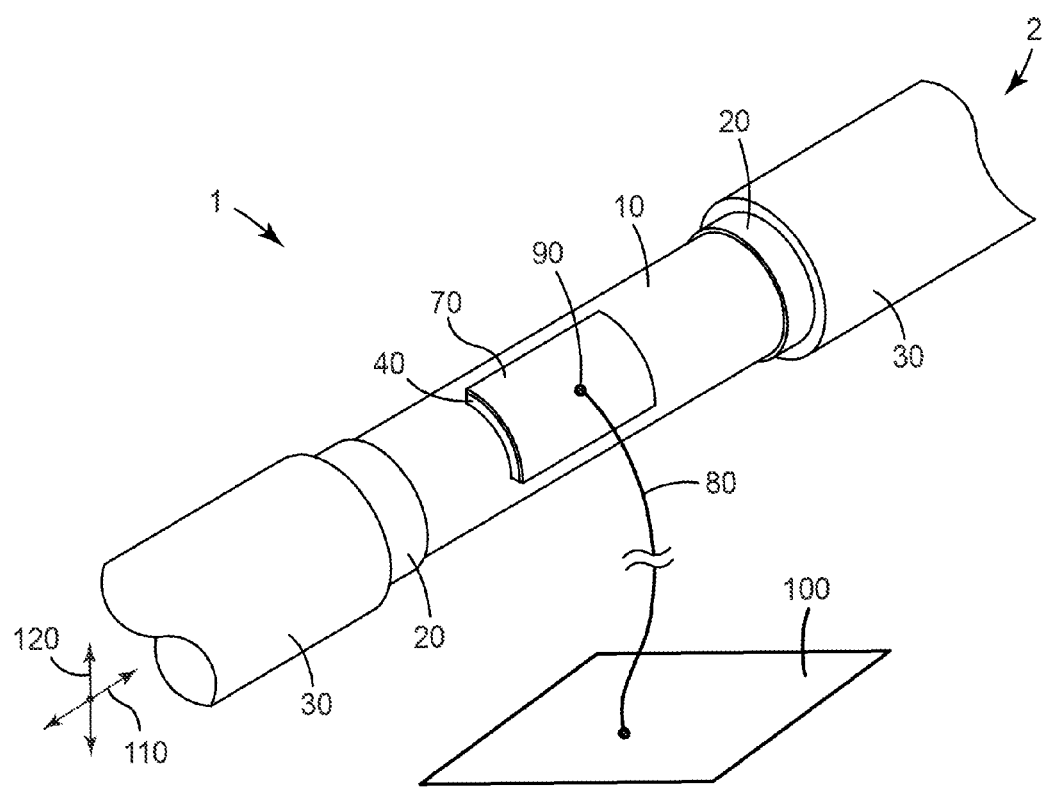

FIG. 1 Schematic cross section of a first conductor assembly according to the invention;

FIG. 2 Schematic cross section of a second conductor assembly according to the invention;

FIG. 3 Schematic cross section of a third conductor assembly according to the invention;

FIG. 4 Schematic cross section of a fourth conductor assembly according to the invention, comprising a multilayer circuit board;

FIG. 5 Sketched perspective view of the first conductor assembly according to the invention.

Herein below various embodiments of the present invention are described and shown in the drawings wherein like elements are provided with the same reference numbers.

FIG. 1 is a schematic cross section of a first conductor assembly 1 according to the invention and a circuit board. An insulating layer 10 is arranged concentrically on an inner conductor 5 of circular cross section. The inner conductor 5 and the insulating layer 10 are an inner conductor and an insulating layer of a high-voltage power cable. The conductor 5 extends longitudinally perpendicular to the plane of the drawing, defining radial and axial directions. A radial direction 120, pointing away from the center of the inner conductor 5, is indicated by arrow 120, axial directions are perpendicular to the plane of the drawing.

A sensing electrode 40 is arranged radially outward of the insulating layer 10, and on the insulating layer 10. The sensing electrode 40 is electrically conductive and comprises a piece of electrically conductive metal foil. The sensing electrode 40 extends, in cross section, around a part of the circumference of the insulating layer 10, namely around about a fifth of the circumference. The sensing electrode 40 is attached to the insulating layer 10 adhesively. The sensing electrode 40 and the inner conductor 5 are operable as electrodes of a sensing capacitor, with the insulating layer 10, arranged between the electrodes, being operable as a dielectric of the sensing capacitor. The sensing capacitor, in turn, is electrically connected such as to be operable as a first dividing capacitor in a capacitive voltage divider. The capacitive voltage divider comprises a second dividing capacitor (not shown), which is electrically connected with the first dividing capacitor and with electrical ground. The capacitive voltage divider is part of a sensor for sensing a voltage of the inner conductor 5 relative to electrical ground.

The inner conductor 5 and the insulating layer 10 are comprised in a high-voltage power cable. That cable comprises further layers at an axial distance from the area where the cross section of FIG. 1 is taken: the cable comprises a semiconductive layer arranged on the insulating layer 10, a shielding layer arranged on the semiconductive layer, and a cable sheath arranged around the shielding layer. In the axial section where the sensing electrode 40 is arranged on the insulating layer 10, the outer layers of the cable have been removed such as to expose the insulating layer 10. The sensing electrode 40 is applied on the insulating layer 10 in the stripped section of the cable.

The conductor assembly 1 further comprises a voltage pickup element 70. The voltage pickup element 70 has a first major surface 71 and an opposed second major surface 72. The voltage pickup element 70 is an electrically conductive polymer film. Because the polymer film is in itself electrically conductive, the major surfaces 71, 72 of the voltage pickup element 70 are conductive, too. The first major surface 71 is arranged on the radially outer major surface of the sensing electrode 40. The first major surface 71 of the voltage pickup element 70 is therefore in a surface contact with the sensing electrode 40. The sensing electrode 40 and the first major surface 71 of the voltage pickup element 70 are electrically connected and on the same electrical potential. It can thus be said that the voltage pickup element 70 picks up the voltage of the sensing electrode 40. Due to the extended contact area between these elements, resistive losses between the sensing electrode 40 and the voltage pickup element 70 are reduced. The voltage pickup element 70 extends around a smaller portion of the circumference of the insulating layer 10 than the sensing electrode 40 extends, in cross section.

An electrically conductive electrode wire 80 is attached to the voltage pickup element 70 at a contact point 90 on the second major surface 72. Its end portion is soldered to the contact point 90, so that the electrode wire 80 is in electrical and mechanical contact with the voltage pickup element 70. The contact point 90 is electrically conductive and electrically connects the voltage pickup element 70 and the electrode wire 80 with each other. Thereby, the electrode wire 80, the contact point 90, the voltage pickup element 70 and the sensing electrode 40 are electrically connected with each other.

The electrode wire 80 extends from the contact point 90 to a circuit board 100. An end portion of the electrode wire 80 is attached to the circuit board 100. On the circuit board 100, the electrode wire 80 is electrically connected to a further capacitor. This further capacitor is the second dividing capacitor of a capacitive voltage divider. The capacitive voltage divider allows sensing the voltage of the inner conductor 5 relative to electrical ground. Electrical circuits for this voltage sensing are known. In addition to the further capacitor, other electric or electronic components for sensing the voltage of the inner conductor 5, are arranged on the circuit board 100. The further capacitor and the other electric or electronic components and/or the circuit board 100 are arranged more than 10 millimeters away from the sensing electrode 40, in other words, they are arranged remote from the sensing electrode 40. The electrode wire 80 makes the voltage signal of the sensing electrode 40 available at a location remote from the sensing electrode 40.

FIG. 2 is a schematic cross section of a second conductor assembly 1' according to the invention and a circuit board 100. The second conductor assembly 1' and the circuit board 100 are identical to the first conductor assembly 1 and the circuit board 100 shown in FIG. 1, except that the sensing electrode 40' extends around the full circumference of the insulating layer 10, in cross section. Also in the second conductor assembly 1', the inner conductor 5 and the insulating layer 10 are an inner conductor and an insulating layer of a high-voltage power cable, respectively. The sensing electrode 40' is formed by a ring-shaped portion of a semiconductive layer of the cable, which is electrically isolated from other portions of the semiconductive layer of the cable. That semiconductive layer is a regular layer of the cable. In the stripped portion of the cable, shown in the cross section of FIG. 2, the semiconductive layer has been removed such as to expose the insulating layer 10 of the cable, except in an axial section of the cable, where a ring-shaped axial section of the semiconductive layer was left on the insulating layer 10. This ring-shaped section forms the sensing electrode 40 visible in FIG. 2. The remaining ring-shaped section is electrically isolated from the other portions of the semiconductive layer of the cable, that were not removed by stripping, so that this ring-shaped section can serve as a sensing electrode 40'.

The voltage pickup element 70 and the electrode wire 80 are identical to the corresponding elements in the conductor assembly shown in FIG. 1. Again, the circuit board 100 is located remote from the sensing electrode 40'.

FIG. 3 is a further schematic cross section of a third conductor assembly 1'' according to the invention. It is similar to the first conductor assembly 1, except for the presence of a spacer layer 25, which is arranged on the outer surface of the insulating layer 10 and thus between the insulating layer 10 and the sensing electrode 40. The spacer layer 25 extends, in the cross section, around the full circumference of the insulating layer 10. Since a portion the spacer layer 25 is arranged between the insulating layer 10 and the sensing electrode 40, the spacer layer 25 is operable as a further dielectric of the sensing capacitor, which comprises the inner conductor 5 and the sensing electrode 40 as electrodes, and the insulating layer 10 as a dielectric. The spacer layer 25 establishes a certain distance between the sensing electrode 40 and the inner conductor 5. By choosing a specific thickness and specific electrical properties of the spacer layer 25, the voltage signal on the sensing electrode 40 can be adjusted, so that the signal is in a certain voltage range for a given voltage of the inner conductor.

FIG. 4 is a further schematic cross section of a fourth conductor assembly 1''' according to the invention. It is similar to the first conductor assembly 1, except for the voltage pickup element 70' comprising a multilayer circuit board 240. The multilayer circuit board 240 has a first skin layer 230 and an opposed second skin layer 210. Both skin layers 210, 230 are electrically conductive. The skin layers 210, 230 are the outermost layers of the multilayer circuit board 240. The first skin layer 230 comprises the first major surface 71 of the voltage pickup element 70'. The second skin layer 210 comprises the second major surface 72 of the voltage pickup element 70'. Between the skin layers 210, 230, an intermediate layer 220 is arranged. The intermediate layer 220 comprises a conductive via 225, which provides an electrical connection between the first skin layer 230 and the second skin layer 210. Thereby, the first major surface 71 and the second major surface 72 of the voltage pickup element 70' are electrically connected with each other.

The intermediate layer 220 can accommodate electric or electronic components 227 for processing the voltage signal picked up from the sensing electrode 40. It can accommodate conductive traces (not shown) for electrically connecting the skin layers 210, 230 and/or the electric or electronic components with each other.

FIG. 5 is a sketched perspective view of the first conductor assembly 1 and the circuit board 100 of FIG. 1. The conductor assembly 1 comprises a high-voltage power cable 2. The cable 2 comprises the insulating layer 10, concentrically arranged around the inner conductor 5 (not visible). The conductor 5 defines radial directions 120 and axial directions indicated by a double arrow 110. A semiconductive layer 20 is arranged concentrically around the insulating layer 10, and an electrically insulating cable sheath 30 is arranged around the semiconductive layer 20 of the cable 2. In an axial section, the cable 2 is stripped, i.e. the cable sheath 30 and the semiconductive layer 20 are removed, so that the insulating layer 10 is exposed. In the stripped section, the sensing electrode 40 is arranged on the insulating layer 10, and the voltage pickup element 70 is arranged on the sensing electrode 40, so that the sensing electrode 40 is arranged radially between the insulating layer 10 and the voltage pickup element 70. The cross section of FIG. 1 is taken in the section of the cable 2 in which the sensing electrode 40 and the voltage pickup element 70 are arranged on the insulating layer 10.

The electrode wire 80 is attached to the voltage pickup element 70 at the connection point 90. The electrode wire 80 conducts the voltage signal of the sensing electrode 40 to the remotely located circuit board 100, on which the second dividing capacitor (not shown) of the capacitive voltage divider is arranged, which is part of the voltage sensor for sensing the voltage of the inner conductor 5.

The invention claimed is:

1. Conductor assembly for a power network, the conductor assembly comprising
   an inner conductor, defining axial directions and radial directions,
   an insulating layer arranged concentrically around at least an axial section of the inner conductor, and
   a sensing electrode, arranged radially outward of the insulating layer, and operable as a first electrode of a sensing capacitor of a voltage sensor,
   the inner conductor or a conductor extension is operable as the second electrode of a sensing capacitor of a voltage sensor,
   the conductor assembly further comprising
   a voltage pickup element,
   comprising an electrically conductive first major surface and an opposed electrically conductive second major surface, the first major surface being in a surface contact with the sensing electrode, and
   an electrode wire, in electrical and mechanical contact with the voltage pickup element, for electrically connecting the voltage pickup element with an electric or electronic component disposed remote from the sensing electrode,
   wherein the voltage pickup element comprises one of an electrically conductive metal film, a metallized film, or an electrically conductive polymeric film.

2. Conductor assembly according to claim 1, wherein the first major surface and the second major surface of the voltage pickup element are electrically connected with each other.

3. Conductor assembly according to claim 2, wherein the electrode wire is in mechanical and electrical contact with the second major surface of the voltage pickup element.

4. Conductor assembly according claim 1, wherein the voltage pickup element has an electrically conductive body portion, arranged between the first major surface and the second major surface.

5. Conductor assembly according to claim 1, wherein the voltage pickup element comprises a conformable portion.

6. Conductor assembly according to claim 1, wherein the sensing electrode and the voltage pickup element are comprised in a cable accessory device, a cable splice body, or a cable termination body.

7. Conductor assembly according to claim 1, further comprising an electrically insulating spacer layer, arranged radially between the insulating layer and the sensing electrode.

8. Conductor assembly according to claim 1, wherein the inner conductor comprises an inner conductor of a medium-voltage or high-voltage power cable, and where the insulating layer comprises an insulating layer of a medium-voltage or high-voltage power cable.

9. High-voltage or medium-voltage power cable comprising a conductor assembly according to claim 1.

10. Power network comprising a high-voltage or medium-voltage power cable according to claim 9.

* * * * *